US012495254B2

United States Patent
Yu

(10) Patent No.: US 12,495,254 B2
(45) Date of Patent: Dec. 9, 2025

(54) SIGNAL AMPLIFICATION APPARATUS BASED ON LOAD RESISTANCE CONTROL AND AUDIO TERMINAL INCLUDING THE SAME

(71) Applicant: Meewang Inc., Seoul (KR)

(72) Inventor: Seung Ho Yu, Incheon (KR)

(73) Assignee: Meewang Inc., Seoul (KR)

( * ) Notice: Subject to any disclaimer, the term of this patent is extended or adjusted under 35 U.S.C. 154(b) by 401 days.

(21) Appl. No.: 18/190,445

(22) Filed: Mar. 27, 2023

(65) Prior Publication Data
US 2023/0328440 A1 Oct. 12, 2023

(30) Foreign Application Priority Data

Apr. 12, 2022 (KR) .................. 10-2022-0045286

(51) Int. Cl.
*H04R 5/04* (2006.01)
*H03F 3/183* (2006.01)
*H03G 7/00* (2006.01)

(52) U.S. Cl.
CPC .............. *H04R 5/04* (2013.01); *H03F 3/183* (2013.01); *H03G 7/004* (2013.01)

(58) Field of Classification Search
None
See application file for complete search history.

(56) References Cited

U.S. PATENT DOCUMENTS

| | | | | | |
|---|---|---|---|---|---|
| 5,216,379 | A | * | 6/1993 | Hamley | ................ H03F 3/085 330/297 |
| 5,532,649 | A | * | 7/1996 | Sahyoun | ............. H03G 1/0088 330/297 |
| 10,361,672 | B2 | * | 7/2019 | Randall | ................ H03G 7/007 |
| 12,041,434 | B2 | * | 7/2024 | Lesso | ....................... H03F 3/68 |
| 2023/0412134 | A1 | * | 12/2023 | Lind | ..................... H03F 1/0277 |

FOREIGN PATENT DOCUMENTS

KR 20-1990-0007017 Y1 8/1990

* cited by examiner

*Primary Examiner* — Paul W Huber

(57) ABSTRACT

Disclosed are a load resistor control based signal amplification apparatus and an audio terminal including the same. The signal amplification apparatus according to the exemplary embodiment of the present disclosure selects at least one load resistor based on a load value of an output terminal connected to an output end and controls a current by means of at least one selected load resistor to amplify the audio input signal and output the audio output signal.

10 Claims, 6 Drawing Sheets

FIG. 5

| Accessory Type | Impedance Step | Target Range [Ω] |
|---|---|---|
| Headset #1 | Step 0 | 0 to 24 |
| Headset #2 | Step 1 | 24 to 42 |
| Headset #3 | Step 2 | 42 to 100 |
| Headset #4 | Step 3 | 100 to 200 |
| Headset #5 | Step 4 | 200 to 450 |
| Headset #6 | Step 5 | 450 to 1,000 |
| Line_In/Out (CarKit) | Step 6 | 1,000 to 15,000 |

SIGNAL AMPLIFICATION APPARATUS BASED ON LOAD RESISTANCE CONTROL AND AUDIO TERMINAL INCLUDING THE SAME

CROSS-REFERENCE TO RELATED APPLICATIONS

This application claims priority to and the benefit of Korean Patent Application No. 10-2022-0045286 filed in the Korean Intellectual Property Office on Apr. 12, 2022, the entire contents of which are incorporated herein by reference.

BACKGROUND

Field

The present disclosure relates to a signal amplification apparatus which operates based on load resistance control and an audio terminal including the same.

Description of the Related Art

The contents described in this section merely provide background information on the exemplary embodiment of the present disclosure, but do not constitute the related art.

In the modern society, in accordance with the improvement of an audio output technique, various studies to improve a texture of the audio output are being conducted.

There are various components which affect the texture of the audio output. Among them, an operation of amplifying a signal especially affects an audio output texture. A Class A amplifier which is one of the amplifying methods of the audio signal is a method used for an audio amplifier in the early days and a vacuum tube amplifier is a representative example.

A typical Class A amplifier causes least modification or distortion in a sound quality as compared with the other class amplifier and is a preferred amplification method especially among classic music fans.

However, in the typical Class A amplifier, a lot of currents flow even though there is no signal or load so that large current consumption is caused. Further, the current consistently flows so that a lot of heat is generated. Further, it is difficult to be applied to a portable product due to the current consumption.

SUMMARY

A main object of the present invention is to provide a signal amplification apparatus based on load resistance control which selects at least one load resistor based on a load value of an output terminal and controls the current through at least one selected load resistor to amplify an audio input signal to output an audio output signal and an audio terminal including the same.

According to an aspect of the present disclosure, in order to achieve the above-described objects, provided is a signal amplification apparatus which amplifies an audio input signal in which at least one load resistor is selected based on a load value of an output terminal connected to an output end and a current is controlled by means of at least one selected load resistor to amplify the audio input signal and output the audio output signal.

Further, according to another aspect of the present disclosure, in order to achieve the above-described objects, An audio terminal which reproduces an audio includes: an audio input module which receives a digital signal based audio signal; a signal conversion module which converts the audio signal into an analog signal based audio input signal; an amplification processing module which selects at least one load resistor based on a load value of an output terminal connected to an audio output module and controls a current by means of at least one selected load resistor to amplify the audio input signal; and an audio output module which transmits an audio output signal amplified by a current controlled based on at least one selected load resistor to the connected output terminal.

As described above, according to the present disclosure, the current is changed by a class A amplifier based structure to minimize unused current.

Further, according to the present disclosure, a current for amplification may be automatically changed according to a load of an output terminal.

Further, according to the present disclosure, when the audio terminal is paused or is not used by a user for a long time, a current supplied to amplify a signal is shut off and thus the heat generation in the terminal is minimized.

Further, according to the present disclosure, currents at the ends of a first voltage (V+) and a second voltage (V−) are controlled to amplify the audio signal, thereby optimizing a signal amplification current.

BRIEF DESCRIPTION OF THE DRAWINGS

FIG. 5 is an exemplary view for explaining a load resistance control operation based on a load detection result of a signal amplification apparatus according to an exemplary embodiment of the present disclosure.

DETAILED DESCRIPTION OF THE EMBODIMENT

Hereinafter, exemplary embodiments of the present disclosure will be described in detail with reference to the accompanying drawings. In the description of the present disclosure, if it is considered that the specific description of related known configuration or function may cloud the gist of the present disclosure, the detailed description will be omitted. Further, hereinafter, exemplary embodiments of the present disclosure will be described. However, it should be understood that the technical spirit of the invention is not restricted or limited to the specific embodiments, but may be changed or modified in various ways by those skilled in the art to be carried out. Hereinafter, a load resistance control based signal amplification apparatus proposed by the present disclosure and an audio terminal including the same will be described in detail with reference to the drawings.

Figure 1:
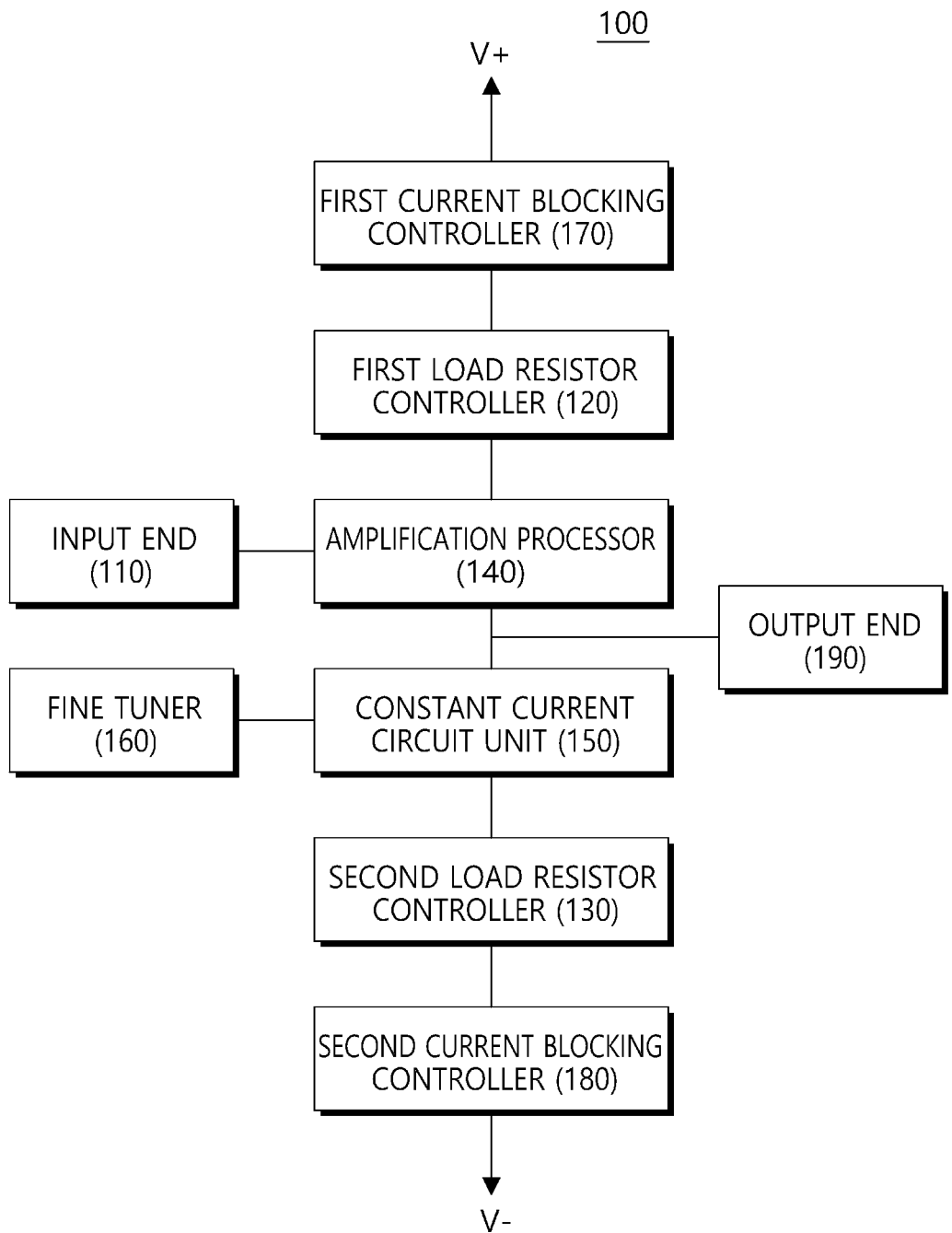
FIG. 1 is a block diagram schematically illustrating a signal amplification apparatus according to an exemplary embodiment of the present disclosure.

FIG. 1 is a block diagram schematically illustrating a signal amplification apparatus according to an exemplary embodiment of the present disclosure.

A signal amplification apparatus 100 according to the present exemplary embodiment includes an input end 110, a first load resistance controller 120, a second load resistance controller 130, an amplification processor 140, a constant current circuit unit 150, a fine tuner 160, a first current blocking unit 170, a second current blocking unit 180, and an output end 190. The signal amplification apparatus 100 of FIG. 1 is an example so that all blocks illustrated in FIG. 1 are not essential components and in the other exemplary embodiment, some blocks included in the signal amplification apparatus 100 may be added, modified, or omitted.

The signal amplification apparatus 100 according to the exemplary embodiment selects a load resistor based on a load value of an output terminal connected to an output end and controls a current by controlling a selected load resistor to perform an audio signal amplifying operation.

The signal amplification apparatus 100 is formed based on a class A amplifier structure. Specifically, the signal amplification apparatus 100 selects at least one load resistors among a plurality of load resistors which is connected in parallel to perform current control and amplifies an audio input signal through the controlled current to output an amplified audio output signal. Hereinafter, components included in the signal amplification apparatus 100 will be described.

The input end 110 receives an audio input signal for signal amplification.

The audio input signal input to the input end 110 is desirably an analog signal.

The input end 110 is connected to a signal conversion module in the audio terminal to receive an audio input signal from the signal conversion module. Here, the signal conversion module may be a digital to analog converter (DAC) module.

The first load resistance controller 120 and the second load resistance controller 130 may select at least one load resistor based on a predetermined control signal and perform the current control through at least one selected load resistor.

The first load resistance controller 120 and the second load resistance controller 130 allow a lot of current to flow between a first voltage V+ and a second voltage V− and select a combination of at least one load resistor or at least one load resistor to control the current to flow less.

The first load resistance controller 120 receives a control signal and selects at least one load resistor based on the control signal.

The first load resistance controller 120 controls a current for signal amplification through at least one selected load resistor. An output waveform and a sound quality of the audio output signal according to the signal amplification are determined based on an intensity of the current controlled by the first load resistance controller 120.

The first load resistance controller 120 includes a plurality of load resistor units 122 and 124 which is connected in parallel.

The plurality of load resistor units 122 and 124 are configured by load resistors 210 and 220 and switching devices 212 and 222.

The switching devices 212 and 222 are desirably MOS transistors, but are not necessarily limited thereto. For example, as long as the switching device is controlled to be switched on/off to select the load resistors 210 and 220, the switching devices 212 and 222 may be implemented by various types of switching devices.

The load resistors 210 and 220 of the plurality of load resistor units 122 and 124 may have different resistances, but are not necessarily limited thereto and the load resistors 210 and 222 may have the same resistance.

The first load resistance controller 120 controls a current which flows from the first voltage to the second voltage and is connected to be close to the first voltage.

The first load resistance controller 120 is connected between the first voltage and an amplification processor 140. Further, the first current blocking unit 170 may be further connected between the first voltage and the first load resistance controller 120.

The second load resistance controller 130 receives a control signal and selects at least one load resistor based on the control signal.

The second load resistance controller 130 controls a current for signal amplification through at least one selected load resistor. An output waveform and a sound quality of the audio output signal according to the signal amplification are determined based on an intensity of the current controlled by the second load resistance controller 130.

The second load resistance controller 130 includes a plurality of load resistor units 132 and 134 which is connected in parallel.

The plurality of load resistor units 132 and 134 are configured by load resistors 232 and 242 and switching devices 230 and 240.

The switching devices 230 and 240 are desirably MOS transistors, but are not necessarily limited thereto. For example, as long as the switching device is controlled to be switched on/off to select the load resistors 230 and 240, the switching devices 232 and 242 may be implemented by various types of switching devices.

The load resistors 232 and 242 of the plurality of load resistor units 132 and 134 may have different resistances, but are not necessarily limited thereto and the load resistors 232 and 242 may have the same resistance.

The second load resistance controller 130 controls a current which flows from the first voltage to the second voltage and is connected to be close to the second voltage.

The second load resistance controller 130 is connected between the amplification processor 140 and the second voltage. Further, the second current blocking unit 180 may be further connected between the second voltage and the second load resistance controller 130. Further, the constant current circuit unit 150 and the fine tuner 160 may be further connected between the amplification processor 140 and the second load resistance controller 130.

The amplification processor 140 performs an operation of amplifying an audio input signal based on a controlled current.

The amplification processor 140 is connected between the input end 110 and the output end 190 and amplifies the audio input signal, and transmits the amplified audio output signal to the output end 190. The amplification processor 140 is configured by two BJT transistors.

The amplification processor 140 is connected to the first voltage and the second voltage to process the amplification and amplifies a signal by a current flowing from the first voltage to the second voltage.

An intensity of a current flowing to the amplification processor 140 is adjusted by the first load resistance controller 120, the second load resistance controller 130, and the fine tuner 160.

The constant current circuit unit 150 and the fine adjuster 160 perform the fine tuning of a current for signal amplification.

The constant current circuit unit 150 performs the connection of the fine tuner 160 and the constant current control of the amplification processor 140. The operation of the constant current circuit unit 150 is the same as a typical constant-current circuit.

The constant current circuit unit 150 is connected to the amplification processor 140 and the output end 190 is connected between the constant current circuit unit 150 and the amplification processor 140. The constant current circuit unit 150 is configured by two BJT transistors.

The fine tuner 160 is connected to the constant current circuit unit 150 and includes a variable resistor for fine tuning of the current.

The fine tuner 160 serves to change a tone color according to a sound preference of the user who uses the output terminal 602.

One end of the variable resistor included in the fine tuner 160 is connected to a first resistor and the other end is connected to the constant current circuit unit 150 and the second voltage.

The variable resistor of the fine tuner 160 has a structure in which two resistors R1 and R2 are connected. The fine tuner 160 performs the fine tuning of the current according to the resistance change of a voltage fed back from a node connected to the first voltage between two resistors R1 and R2.

The first current blocking unit 170 and the second current blocking unit 180 perform an operation of shutting off the current when the signal amplification apparatus 100 does not perform the signal amplification.

The typical class A amplifier has a problem in that the current flows even when the signal amplification is not performed.

In the signal amplification apparatus 100 according to the exemplary embodiment, the current flowing from the first voltage to the second voltage may be blocked by the first current blocking unit 170 and the second current blocking unit 180.

The first current blocking unit 170 is connected to one end of the first load resistance controller 120. The first current blocking unit 170 is connected between the first resistor and the first load resistance controller 120.

The first current blocking unit 170 is configured by a switching device. Here, the switching device is desirably an MOS transistor, but is not necessarily limited thereto and may be implemented by various types of switching devices as long as it is controlled to be on or off switched to allow or block the current.

The second current blocking unit 180 is connected to one end of the second load resistance controller 130. The second current blocking unit 180 is connected between the second resistor and the second load resistance controller 130.

The second current blocking unit 180 is configured by a switching device. Here, the switching device is desirably an MOS transistor, but is not necessarily limited thereto and may be implemented by various types of switching devices as long as it is controlled to be on or off switched to allow or block the current.

The output end 190 performs an operation of outputting an audio output signal obtained by amplifying the audio input signal to an external terminal.

The output end 190 is connected to the output terminal 602 and transmits the amplified audio output signal to the output terminal 602. Here, the output terminal 602 may be at least one device, among various devices which output an audio signal, such as earphones, headsets, speakers, and hearing aids.

The signal amplification apparatus 100 according to the present exemplary embodiment further includes a controller (not illustrated) which generates a control signal to control switching devices included in the first load resistance controller 120, the second load resistance controller 130, the first current blocking unit 170, and the second current blocking unit 180. Here, even though it is described that the controller is a module included in the signal amplification apparatus 100, it is not necessarily limited thereto and may be implemented as a separate device which interworks with the signal amplification apparatus 100.

A control signal for controlling the switching device may be manually or automatically controlled according to a load value of the output terminal 602 connected to the signal amplification apparatus 100.

Figure 2:
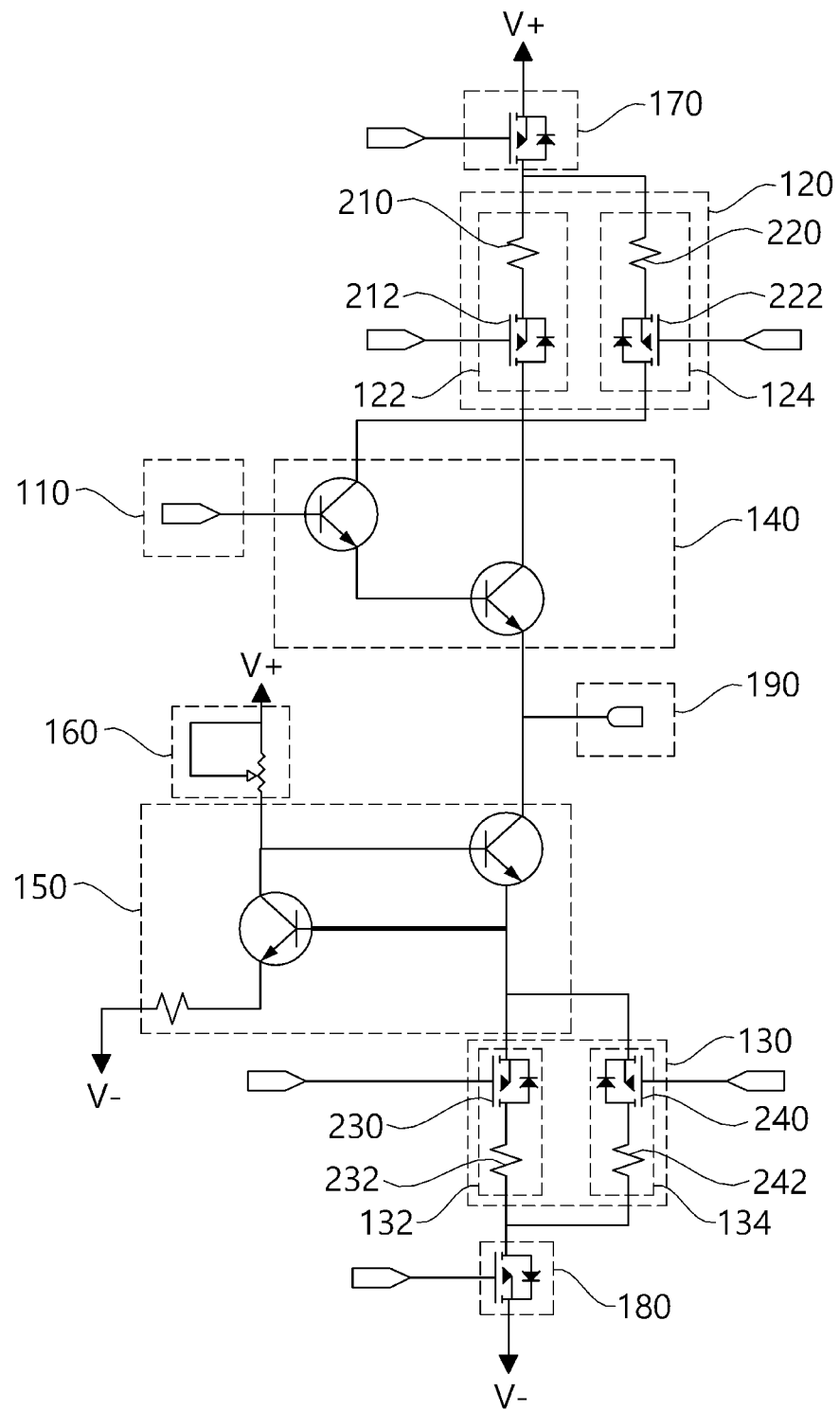
FIG. 2 is a view illustrating a circuit configuration of a signal amplification apparatus according to an exemplary embodiment of the present disclosure.

FIG. 2 is a view illustrating a circuit configuration of a signal amplification apparatus according to an exemplary embodiment of the present disclosure.

A signal amplification apparatus 100 according to the exemplary embodiment includes a first load resistance controller 120, a second load resistance controller 130, and an amplification processor 140. The first load resistance controller 120, the amplification processor 140, and the second load resistance controller 130 are connected in series between the first voltage and the second voltage in this order. Here, the first voltage has a larger voltage value than that of the second voltage.

The amplification processor 140 is connected to an input end and a contact node between the amplification processor 140 and the second load resistance controller 130 is connected to an output end 190.

Each of the first load resistance controller 120 and the second load resistance controller 130 includes at least one load resistor unit connected in parallel and each load resistor unit is configured by a load resistor and an MOS transistor.

The signal amplification apparatus 100 further includes a constant current circuit unit 150 and a fine tuner 160.

The fine tuner 160 includes a variable resistor for fine tuning of the current.

The constant current circuit unit 150 is configured by at least two BJT transistors. The constant current circuit unit 150 is connected between the amplification processor 140 and the second load resistance controller 130 to finely adjust a current through the fine tuner 160.

The signal amplification apparatus 100 further includes a first current blocking unit 170 and the second current blocking unit 180 to block the current for amplification of the audio input signal when the audio input signal is not input.

Each of the first current blocking unit 170 and the second current blocking unit 180 may be configured by an MOS transistor.

The first current blocking unit 170 is connected between a node to which a first voltage is applied and the first load resistance controller 120. Further, the second current blocking unit 180 is connected between a node to which a second voltage is applied and the second load resistance controller 130.

Hereinafter, a circuit connection configuration of the signal amplification apparatus 100 will be described with reference to FIG. 2.

The amplification processor 140 is configured by two BJT transistors. A base of a first BJT transistor is connected to the input end 110 and an emitter of the first BJT transistor is connected to a base of a second BJT transistor.

Collectors of the first BJT transistor and the second BJT transistor are connected to one ends of load resistors 122 and 124 included in the first load resistance controller 120.

An emitter of the second BJT transistor is connected to an output end 190 and a contact node between the emitter of the second BJT transistor and the output end 190 is connected to the second load resistance controller 130.

In the meantime, when the signal amplification apparatus 100 further includes a constant current circuit unit 150 and a fine tuner 160, a contact node between the emitter of the second BJT transistor and the output end 190 is connected to a collector of a third BJT transistor of the constant current circuit unit 150. The collector of the third BJT transistor of the constant current circuit unit 150 is connected to a base of the third BJT transistor and the fine tuner 160. The constant current circuit unit 150 is connected to one ends of the load resistor units 132 and 134 included in the second load resistance controller 130.

Further, the other ends of the load resistors 122 and 124 included in the first load resistance controller 120 are connected to the first current blocking unit 170 and the first current blocking unit 170 is connected to a first voltage V+.

Further, the other ends of the load resistors 132 and 134 included in the second load resistance controller 130 are connected to the second current blocking unit 180 and the second current blocking unit 180 is connected to a second voltage V−.

Figure 3:
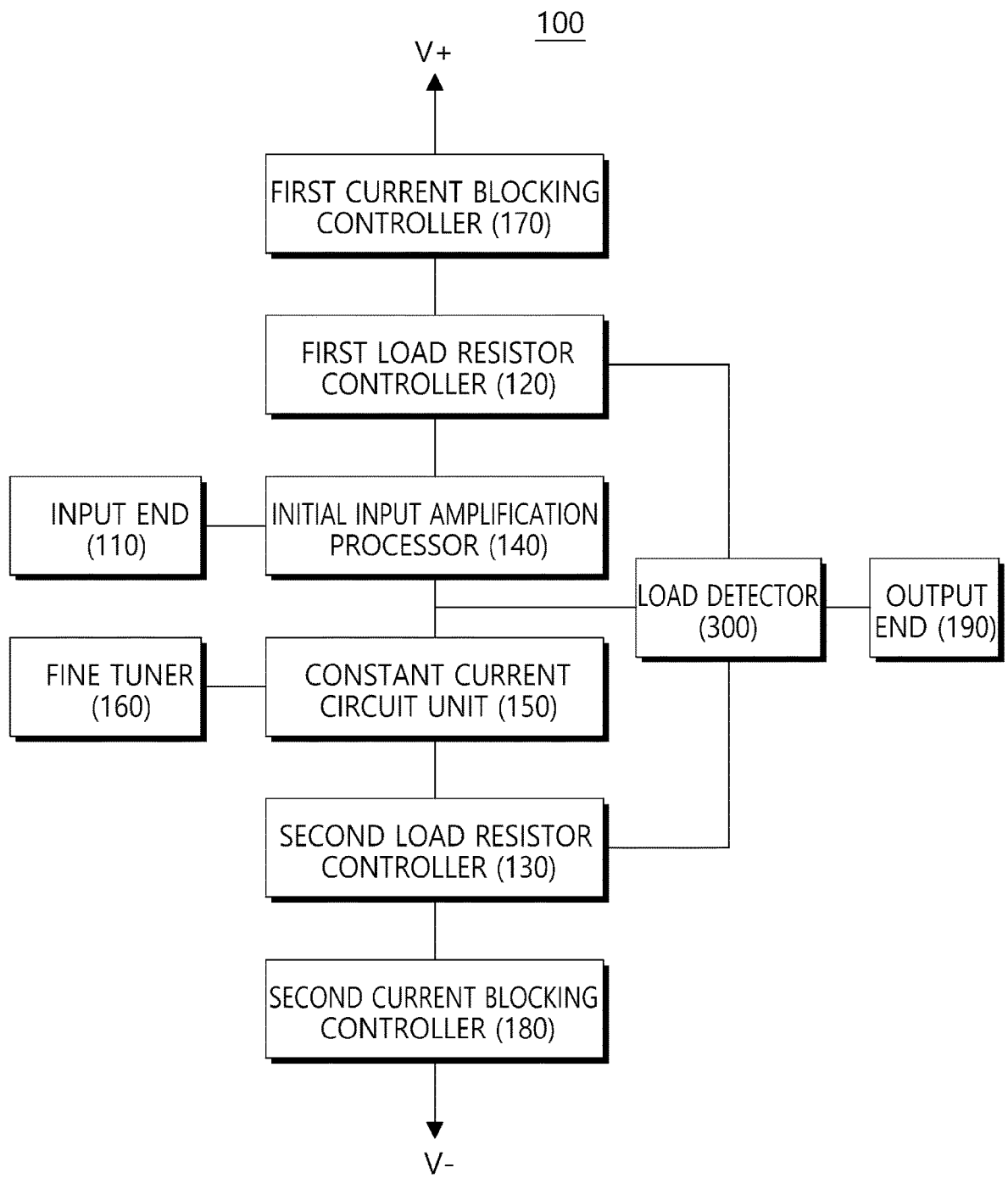
FIG. 3 is a block diagram schematically illustrating a signal amplification apparatus including a load detector according to an exemplary embodiment of the present disclosure.

FIG. 3 is a block diagram schematically illustrating a signal amplification apparatus including a load detector according to an exemplary embodiment of the present disclosure.

The signal amplification apparatus 100 according to the exemplary embodiment further includes a load detector 300 which detects a load value of an output terminal 602 connected to the output end 190.

In FIG. 3, the signal amplification apparatus 100 to which the load detector 300 is added will be described. In FIG. 3, a description for the repeated configuration with the description of the signal amplification apparatus 100 which has been described with reference to FIGS. 1 and 2 will be omitted.

The load detector 300 is connected to the output end 190 and detects a load value of the output terminal 602.

The load detector 300 may be connected between the output end 190 and the amplification processor 140, but is not necessarily limited thereto and may be connected between the output end 190 and the output terminal 602.

For example, when it is confirmed that a load detection result obtained by detecting a load value of the output terminal 602 is 8 ohm, 16 ohm, 32 ohm, 300 ohm, and 600 ohm, the load detector 300 adjusts a control signal which is transmitted to the first load resistance controller 120 and the second load resistance controller 130 in accordance with the load detection result to reselect at least one load resistor for controlling the current.

The load detector 300 adjusts a control signal according to a load detection result, but is not necessarily limited thereto, and transmits the load detection result to the controller (not illustrated) to adjust the control signal.

The signal amplification apparatus 100 according to the exemplary embodiment selects a candidate of a load resistor based on a control signal which is generated or adjusted based on the load detection result.

The signal amplification apparatus 100 further identifies a resistance adjustment condition and finally determines a final load resistor depending on whether a resistance adjustment condition matches. Here, the resistance adjustment condition may be an adjustment condition set depending on the preference of the user or an adjustment condition set to a specific load value.

The signal amplification apparatus 100 may apply one resistance adjustment condition to determine a final load resistor, but is not necessarily limited thereto.

For example, the signal amplification apparatus 100 determines a final load resistor corresponding to a result applied by selecting or adding a first weigh resistance for a load value of the output terminal 602 corresponding to a preference of the user and a second weight resistance set to a specific load value, in accordance with a predetermined conditional priority.

Figure 4:
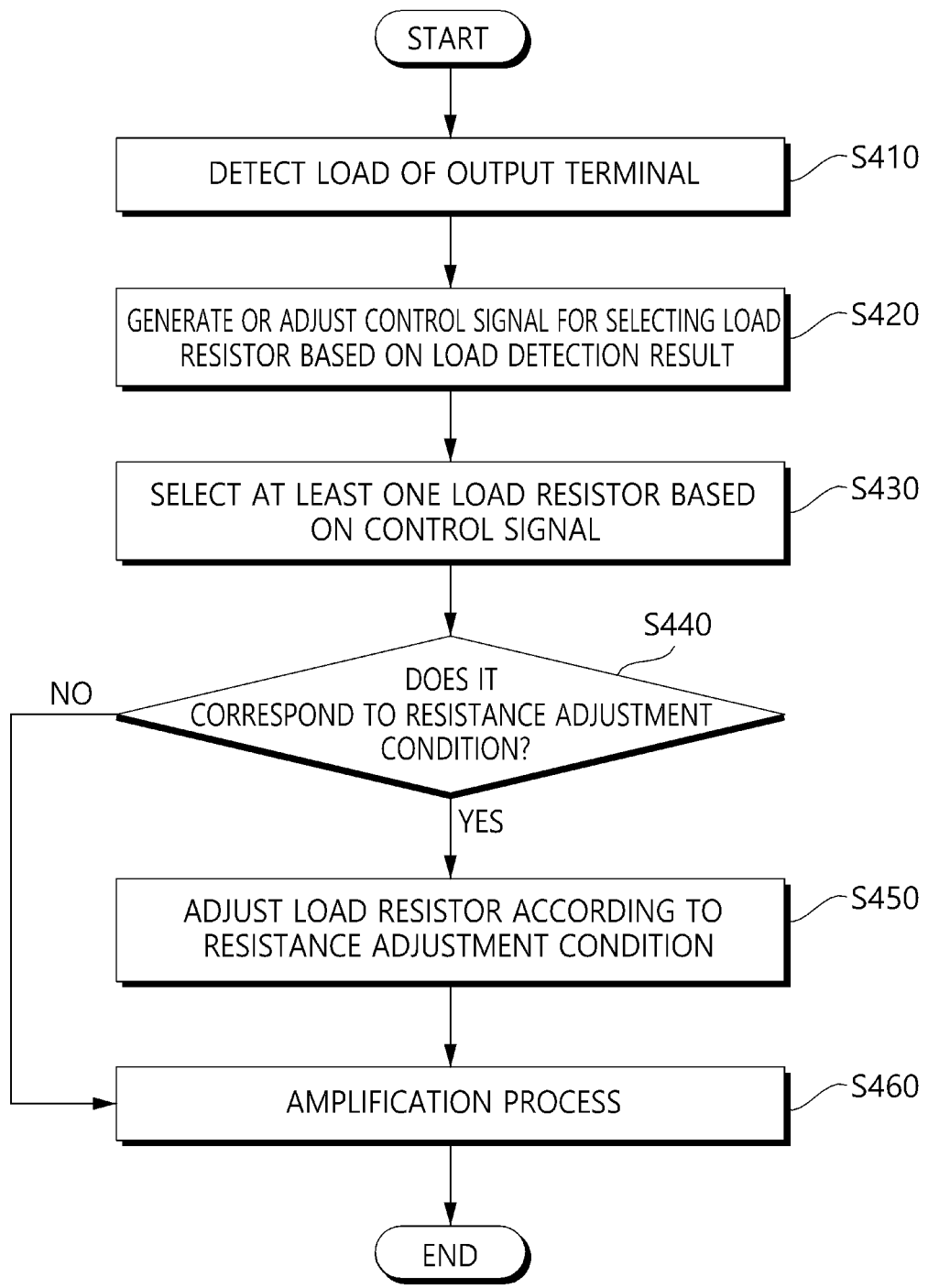
FIG. 4 is a flowchart for explaining a signal amplification processing method based on load detection according to an exemplary embodiment of the present disclosure.

FIG. 4 is a flowchart for explaining a signal amplification processing method based on load detection according to an exemplary embodiment of the present disclosure.

The signal amplification apparatus 100 detects a load value of the output terminal 602 in step S410.

The signal amplification apparatus 100 generates or adjusts a control signal for selecting a load resistor based on a load detection result in step S420.

The signal amplification apparatus 100 selects at least one load resistor based on the control signal.

The signal amplification apparatus 100 determines whether to correspond to a resistor adjustment condition. Here, the resistor adjustment condition is an adjustment condition set according to the preference of the user or an adjustment condition set to a specific load value and a condition for adding or removing a predetermined load resistor.

When in step S440, it corresponds to the resistor adjustment condition, the signal amplification apparatus 100 performs load resistor adjustment to add or remove a predetermined load resistor to a load resistor or from the load resistor selected according to the resistor adjustment condition (S450) and amplifies the audio signal based on a current controlled by a finally selected load resistor (S460).

In the meantime, when in step S440, it does not correspond to the resistor adjustment condition, the signal amplification apparatus 100 amplifies the audio signal based on a load resistor selected based on the control signal in step S460.

Even though in FIG. 4, it is described that the steps are sequentially performed, the present invention is not necessarily limited thereto. In other words, the steps illustrated in FIG. 4 may be changed or one or more steps may be performed in parallel so that FIG. 4 is not limited to a time-series order.

FIG. 5 is an exemplary view for explaining a load resistance control operation based on a load detection result of a signal amplification apparatus according to an exemplary embodiment of the present disclosure.

The signal amplification apparatus 100 according to the exemplary embodiment detects a load value of the output terminal 602 connected to the output end 190 through the load detector 300 and generates a load detection result of the output terminal 602 according to the detected load value.

Referring to FIG. 5, the load detector 300 measures an impedance for a connection terminal of the output terminal 602 to detect a load value and compares the detected load value with a predetermined reference load range to determine a type of the output terminal 602 and generate a load detection result.

When a number of load resistor units included in the first load resistance controller 120 and the second load resistance controller 130 of the signal amplification apparatus 100 which are connected in parallel is adjusted, a range of an adjustable current may be expanded according to the output terminal 602.

Figure 6:
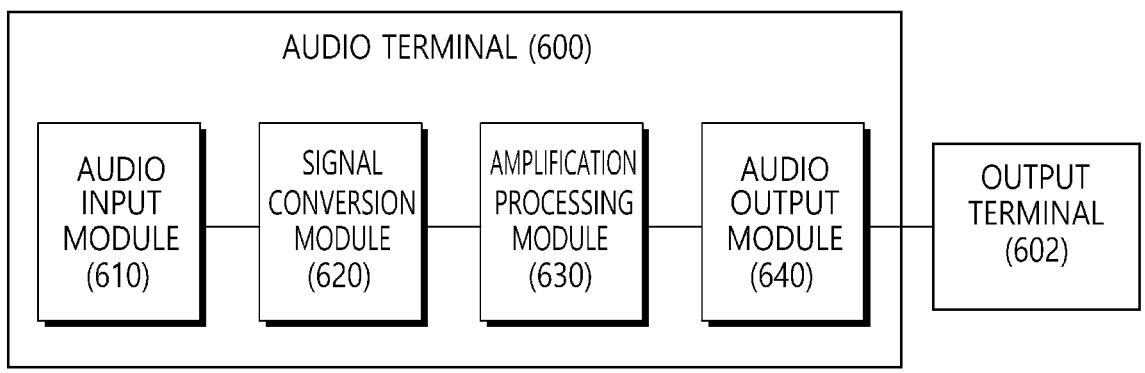
FIG. 6 is a block diagram schematically illustrating an audio output system according to an exemplary embodiment of the present disclosure.

FIG. 6 is a block diagram schematically illustrating an audio output system according to an exemplary embodiment of the present disclosure.

An audio output system according to the exemplary embodiment includes an audio terminal 600 and an output terminal 602.

The audio terminal 600 performs an operation of converting and amplifying an audio signal to output the signal to the output terminal 602.

The audio terminal 600 according to the exemplary embodiment includes an audio input module 610, a signal conversion module 620, an amplification processing module 630, and an audio output module 640. The audio terminal 600 of FIG. 6 is an example so that all blocks illustrated in FIG. 6 are not essential components and in the other exemplary embodiment, some blocks included in the audio terminal 600 may be added, modified, or omitted.

The audio input module 610 receives an audio signal (a sound source signal) and transmits the input audio signal to the signal conversion module 620. Here, the audio signal is a digital discrete signal, but is not necessarily limited thereto, and may be a digital type signal related to the audio source.

The audio input module 610 is connected to a separate device or module including a processor or a memory to receive data about an audio signal, but is not necessarily limited thereto.

The signal conversion module 620 performs an operation of receiving an audio signal from the audio input module 610 and converting a digital type audio signal into an analog signal based audio input signal. The signal conversion module 620 is desirably a digital analog converter (DAC).

The amplification processing module 630 performs an operation of receiving and amplifying an analog signal output from the signal conversion module 620.

The amplification processing module 630 selects at least one load resistor based on a load value of the output terminal 602 connected to the audio output module 640 and controls a current through at least one selected load resistor to amplify the audio input signal. A detailed description and a structure of the amplification processing module 630 is the same as all or a part of the description in FIGS. 1 to 4 and a redundant description will be omitted.

The audio output module 640 transmits an audio output signal which is amplified by the current controlled based on at least one selected load resistor to the connected output terminal 602.

The output terminal 602 performs an operation of outputting the audio output signal received from the audio output module 640 to the user. The output terminal 602 may be at least one device, among various devices which output an audio signal, such as earphones, headsets, speaker, and hearing aids.

It will be appreciated that various exemplary embodiments of the present disclosure have been described herein for purposes of illustration, and that various modifications and changes may be made by those skilled in the art without departing from the scope and spirit of the present invention. Accordingly, the exemplary embodiments of the present disclosure are not intended to limit but describe the technical spirit of the present invention and the scope of the technical spirit of the present invention is not restricted by the exemplary embodiments. The protective scope of the embodiment of the present disclosure should be construed based on the following claims, and all the technical concepts in the equivalent scope thereof should be construed as falling within the scope of the embodiment of the present disclosure.

What is claimed is:

1. A signal amplification apparatus which amplifies an audio input signal,
   wherein at least one load resistor is selected based on a load value of an output terminal connected to an output end and a current is controlled by means of at least one selected load resistor to amplify the audio input signal and output an audio output signal,
   wherein the signal amplification apparatus comprises:
   an input end which receives the audio input signal;
   a first load resistance controller and a second load resistance controller which select at least one load resistor based on a predetermined control signal and control the current through at least one selected load resistor;
   an amplification processor which amplifies the audio input signal based on the controlled current; and
   the output end which outputs the audio output signal obtained by amplifying the audio input signal to the output terminal,
   wherein the signal amplification apparatus further comprises a first current blocking unit and a second current blocking unit which block a current when the signal amplification is not performed, and
   wherein each of the first current blocking unit and the second current blocking unit is configured by an MOS transistor, and the first current blocking unit is connected to one end of the first load resistance controller and the second current blocking unit is connected to one end of the second load resistance controller.

2. The signal amplification apparatus according to claim 1, wherein the signal amplification apparatus is formed based on a Class A amplifier structure and selects at least one load resistor among a plurality of load resistors which is connected in parallel to control the current and amplifies the audio input signal through the controlled current to output the audio output signal.

3. The signal amplification apparatus according to claim 1, further comprising:
   a fine tuner which includes a variable resistor for fine tuning of the current; and
   a constant current circuit unit which connects the fine tuner and controls a constant current of the amplification processor.

4. The signal amplification apparatus according to claim 1, further comprising:
   a load detector which detects the load value of the output terminal connected to the output end to generate a load detection result.

5. The signal amplification apparatus according to claim 4, wherein the load detector adjusts a control signal which is transmitted to the first load resistance controller and the second load resistance controller according to the load detection result to reselect at least one load resistor for current control.

6. The signal amplification apparatus according to claim 1, wherein the first load resistance controller, the amplification processor, and the second load resistance controller are connected in series between a first voltage and a second voltage in this order, the amplification processor is connected to the input end and a contact node between the amplification processor and the second load resistance controller is connected to the output end, and the first voltage has a greater value than the second voltage.

7. The signal amplification apparatus according to claim 6, wherein each of the first load resistance controller and the second load resistance controller includes:
   at least one load resistor unit which is connected in parallel, and
   each of the at least one load resistor unit is configured by a load resistor and an MOS transistor.

8. The signal amplification apparatus according to claim 7, further comprising:
   a fine tuner which includes a variable resistor for fine tuning of the current; and
   a constant current circuit unit which is configured by at least two BJT transistors and is connected between the amplification processor and the second load resistance controller to finely tune the current through the fine tuner.

9. The signal amplification apparatus according to claim 7,
   wherein the first current blocking unit and the second current blocking unit block a current for amplifying the audio input signal when there is no input of the audio input signal,
   wherein the first current blocking unit is connected between a node to which the first voltage is applied and the first load resistance controller and the second current blocking unit is connected between a node to which the second voltage is applied and the second load resistance controller.

10. A terminal which reproduces an audio, comprising:
    an audio input module which receives a digital signal based audio signal;
    a signal conversion module which converts the audio signal into an analog signal based audio input signal;
    an amplification processing module which selects at least one load resistor based on a load value of an output terminal connected to an audio output module and controls a current by means of at least one selected load resistor to amplify the audio input signal; and
    the audio output module which transmits an audio output signal amplified by the current controlled based on at least one selected load resistor to the connected output terminal,
    wherein the amplification processing module comprises:
      an input end which receives the audio input signal;
      a first load resistance controller and a second load resistance controller which select at least one load resistor based on a predetermined control signal and control the current through at least one selected load resistor;
      an amplification processor which amplifies the audio input signal based on the controlled current; and
      an output end which outputs the audio output signal obtained by amplifying the audio input signal to the output terminal,
    wherein the amplification processing module further comprises a first current blocking unit and a second current blocking unit which block a current when the signal amplification is not performed, and
    wherein each of the first current blocking unit and the second current blocking unit is configured by an MOS transistor, and the first current blocking unit is connected to one end of the first load resistance controller and the second current blocking unit is connected to one end of the second load resistance controller.

* * * * *